United States Patent
Baukus et al.

[11] Patent Number: 6,117,762
[45] Date of Patent: Sep. 12, 2000

[54] METHOD AND APPARATUS USING SILICIDE LAYER FOR PROTECTING INTEGRATED CIRCUITS FROM REVERSE ENGINEERING

[75] Inventors: James P. Baukus, Westlake Village; Lap-Wai Chow, South Pasadena; William M. Clark, Jr., Thousand Oaks, all of Calif.

[73] Assignees: HRL Laboratories, LLC, Malibu; Hughes Electronics Corporation, El Segundo, both of Calif.

[21] Appl. No.: 09/298,293

[22] Filed: Apr. 23, 1999

[51] Int. Cl.⁷ .................................................. H01L 21/4763
[52] U.S. Cl. ..................... 438/618; 438/570; 438/584; 438/597; 438/655
[58] Field of Search .................................... 438/618, 570, 438/584, 597, 655

[56] References Cited

U.S. PATENT DOCUMENTS

| | | |
|---|---|---|
| 4,139,864 | 2/1979 | Schulman . |
| 4,267,578 | 5/1981 | Vetter . |
| 4,583,011 | 4/1986 | Pechar . |
| 5,571,735 | 11/1996 | Mogami et al. . |
| 5,783,846 | 7/1998 | Baukus et al. . |

OTHER PUBLICATIONS

"Silicides for Gates and Interconnections," *VLSI Technology*, edited by S.M. Sze, Bell Laboratories, Inc., pp. 372–380 (1983).

Thomas Frederickson, "A Multiple–Layer–Metal CMOS Process," *Intuitive CMOS Electronics*, Section 5.6., pp. 134–146 (1989).

*Primary Examiner*—Kevin M. Picardat
*Assistant Examiner*—D. M. Collins
*Attorney, Agent, or Firm*—Ladas & Parry

[57] ABSTRACT

A method and apparatus for protecting semiconductor integrated circuits from reverse engineering. Semiconductor active areas are formed on a substrate. A silicide layer is formed both over at least one active area of the semiconductor active areas and over a selected substrate area for interconnecting the at least one active area with another area through the silicide area formed on the selected substrate area. In a preferred embodiment a silicide layer formed on a first active area is interconnectingly merged laterally with a silicide layer formed on a second active area through the silicide layer formed on the selected substrate area.

11 Claims, 4 Drawing Sheets

METHOD AND APPARATUS USING SILICIDE LAYER FOR PROTECTING INTEGRATED CIRCUITS FROM REVERSE ENGINEERING

FIELD OF THE INVENTION

This invention relates to the field of semiconductor integrated circuits, and, in particular, to techniques which help prevent reverse engineering of the integrated circuits.

BACKGROUND OF THE INVENTION

The design, development and manufacturing efforts pertaining to semiconductor integrated circuits involve the understanding of complex structures, processes and manufacturing techniques involving smaller and smaller electronic circuitry. Efforts to be able to achieve such understanding and establish successful design, development and production manufacturing of such integrated circuits involve many man-hours of highly skilled professionals and considerable expense.

On the other hand, to avoid costly man-hours and other significant expenses some developers resort to reverse engineering practices wherein existing devices are taken apart, probed and otherwise examined to determine the physical structures of the resultant integrated circuit under review for subsequent copying. This reverse engineering, which typically relies primarily on obtaining planar optical image of the circuit, in essence attempts to by-pass typical product development efforts and expenses by studying and copying a competitive product.

Various approaches have been developed in an attempt to thwart such reverse engineering efforts, particularly in the field of semiconductor integrated circuits. For example, in U.S. Pat. No. 4, 583,011 issued to Pechar, a pseudo-MOS (metal oxide semiconductor) device is given a depletion implant that is not readily visible to a copier, who would infer from a device's location in the circuit that it would be in enhancement-mode. Instead of disguising circuit elements, some systems have a mechanism to protect the circuit from operating until a correct access code has been entered, as described in U.S. Pat. No. 4,139,864 issued to Schulman and U.S. Pat. No. 4,267,578 issued to Vetter. However, each of the above protection schemes require additional processing and/or uses additional circuitry that is dedicated to security and does not contribute to the basic functioning of the circuit. This increases the cost of circuit production and complicates the circuitry.

Therefore, there still exists a need for a cost effective, easy to implement approach which can help prevent the reverse engineering of semiconductor integrated circuits and help protect developers and manufacturers against design piracy. The present invention provides such an approach.

SUMMARY OF THE INVENTION

The present invention provides a method and apparatus for preventing reverse engineering of integrated circuits by selectively hiding the connectivity of the circuit components (e.g., transistors) so as to make the functionality of a group of components (e.g., transistors) connected together become impossible or very difficult to be determined. The hiding of the circuit components is accomplished through the use of silicide layer masking.

In current semiconductor integrated circuit technology, silicide is widely used as a conductive layer formed on top of the silicon source/drain areas or poly-silicon gate areas so as to lower their resistivity. The thickness of such silicide layers is usually in the range 100 Å–200 Å. Since reverse engineering of circuits still relies primarily on the planar optical image of the circuit, for such a thin layer of silicide an optical microscope can not provide a clear enough image to find and confirm the presence of a silicide layer. As such, the use of the silicide layer in accordance with the present invention provides an effective solution to protect a connection from reverse engineering, and is particularly useful with the latest CMOS fabrication technologies, especially those with feature sizes below 0.5 µm.

In particular, in accordance with the present invention, a method and apparatus is provided for protecting semiconductor integrated circuits from reverse engineering. Semiconductor active areas (e.g., heavily doped source and drain regions) are formed on a substrate (e.g., a wafer of suitable material on or in which components of the integrated circuit are deposited or formed). A silicide layer is formed both over at least one active area of the semiconductor active areas and over a selected substrate area for interconnecting the active area with another area through the silicide area formed on the selected substrate area. In a preferred embodiment a silicide layer formed on a first active area is interconnectingly merged laterally with a silicide layer formed on a second active area through the silicide layer formed on the selected substrate area.

Further, the invention is particularly useful when fabricating a CMOS pair on the substrate wherein an n+ source/drain can be interconnected to a Vss source (e.g., typically the "low" or negative terminal of a voltage supply) through a first silicide layer over the substrate and a p+ source/drain can interconnected to a Vcc source (e.g., typically the "high" or positive terminal of a voltage supply) through a second silicide layer over the substrate.

DETAILED DESCRIPTION

It is generally known that during typical semiconductor integrated circuit (e.g., CMOS) fabrication when feature sizes approach 0.5 µm or below, the implant dose which makes the active regions (e.g., a source or drain) creates a higher surface resistivity. This higher surface resistivity does not allow for a good ohmic contact when a metal contact is placed at the active region. However, to provide for the making of a good ohmic contact a silicide (also occasionally termed salicide) layer is typically placed on top of the regions where a contact is to be made and is situated between the semiconductor and the metal for the contact. The silicide layer is very thin, typically in the range of 100 Å to 200 Å thickness, and is formed by depositing metal (e.g., Ti) on top of the bare silicon surface and sintering it so that the metallic ions move into the silicon and form the high conductivity silicide layer. In accordance with the present invention, this standard silicide process is utilized to make a connection between active regions.

Figure 1:
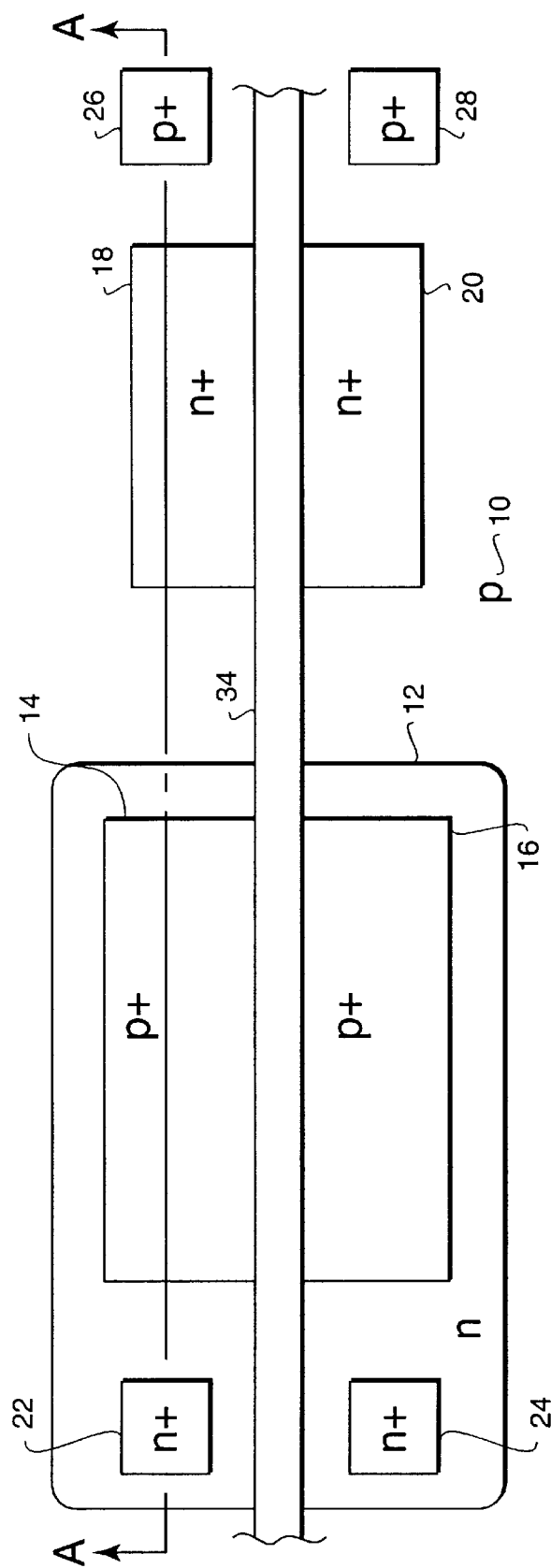
FIG. 1 shows a schematic top plan view of a prior art CMOS pair.
Figure 2:
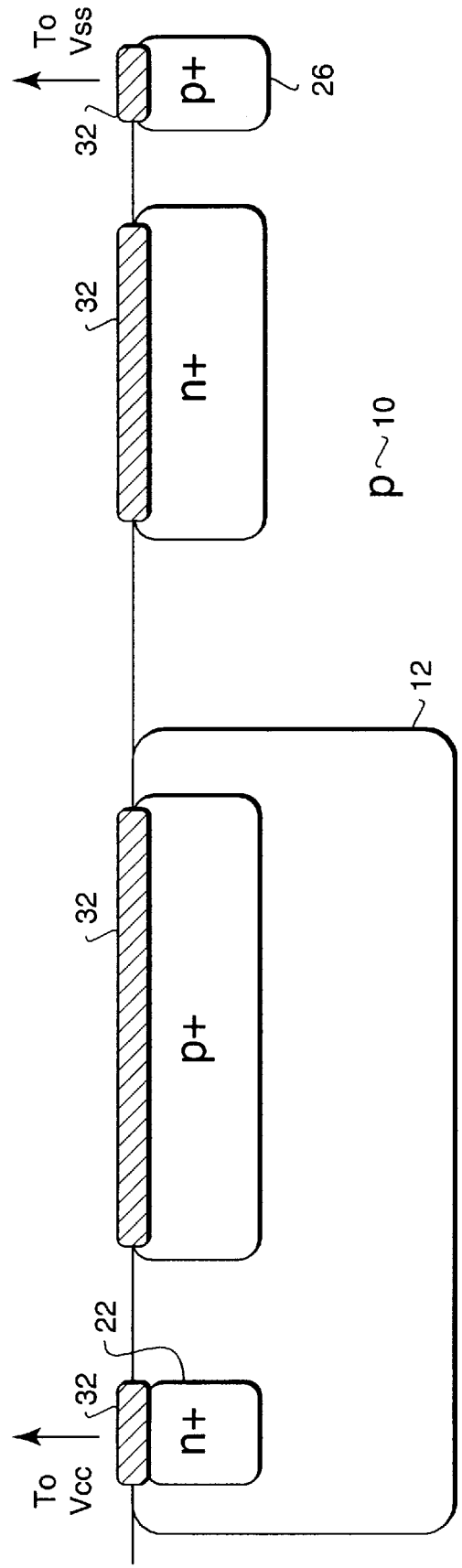
FIG. 2 shows a schematic sectional side view of the prior art CMOS pair depicted in FIG. 1 taken along section line A—A.

To understand the utilization of the silicide layer in accordance with the present invention, consider a typical prior art CMOS pair semiconductor device as schematically depicted in FIGS. 1 and 2.

Referring to FIG. 1 and FIG. 2 collectively, there is shown a respective top plan view and a side section view of a typical prior art CMOS pair. In P-substrate 10 N-well 12 is formed. Polysilicon gate 34 is then deposited creating a channel between any desired source and drain to be formed. In N-well 12 is a p+ source/drain active area 14 and p+ source/drain active area 16 formed by implantation. In P-substrate 10 there is also n+ source/drain active area 18 and n+ source/drain active area 20, the respective sources and drains being formed using gate 34 to create a channel therebetween. There are also n+ regions 22, 24 formed by implantation for connection to a Vcc source and p+ regions 26, 28 formed by implantation for connection to a Vss source. Silicide layer 32 (which is shown in an exaggerated thickness proportion for illustration purposes and is depicted as "eating into" the substrate surface) is formed over n+ regions 22, 24, p+ regions 26, 28, p+ source/drains 14, 16, and n+ source/drains 18, 20. Silicide layer 32 would be typically in the 100 Å–200 Å range. Thereafter, for the connection to the Vcc and Vss sources, normal processing would take place, namely providing appropriate field oxides and metalization layer for the contacts.

Those skilled in the art can appreciate that complex yet well-known steps are involved in practicing a CMOS fabrication process which results the structure depicted in FIG. 1 and FIG. 2, and which is utilized to practice the present invention as will be described hereinbelow. "Intuitive CMOS Electronics", by Frederickson, and, in particular, Section 5.6 entitled "A Multiple-Layer-Metal CMOS Process" describes such a process, to which is added the modern silicide layering process, as described in "VLSI Technology", edited by Simon Sze, on pages 372–380 under the topic "Silicides for Gates and Interconections".

As described in Frederickson, a P-type substrate has silicon dioxide deposited on it. A layer of photo-resist is layered uniformly on top of the silicon dioxide. With a mask, partial regions of the desired circuit are exposed with ultraviolet light. The photoresist is then removed from those regions which were not exposed. A hole in the photoresist results through which the silicon dioxide can be etched. Ion implantation can then occur through the hole and create an N-well by having N-type ions penetrate the silicon surface. For the complementary pair of the CMOS device, there is needed a subsurface region of P-type for one transistor and N-type for the other transistor. An insulating nitride layer can then be placed over the silicon dioxide, and with photoresist can form other structures as needed. Certain regions can then be blocked and allow other regions to be doped (e.g., providing a lightly doped Boron implant). Field oxide regions, which are thick lateral transistor isolating regions, can be then grown. Further masking can allow formation of regions where polysilicon gate structures are to be located. The gates can form a natural blocking region for the deposition of the source and drain by further implantation.

At this point, the silicide process then gets implemented wherein a heavy metal, such as tungsten or titanium, is deposited, in essentially the same implantation openings, and then, in subsequent heat processing form a tungsten silicon, or titanium silicon bond (the silicide layer) which is more highly conductive than the doped implanted layer. It should be noted that the conventional usage of silicide, as described in Sze is for the connection of a higher level metal (e.g., the first level of metal above the silicon surface) to the actual silicon surface itself. The conventional methodology as the technology supports minimum feature sizes at or below 0.5 μm is to merely put a layer of silicide on top of the doped region of semiconductor where the metal is going to contact the semiconductor to improve the ohmic contact. A silicide blocking (masking) layer is typically used to prevent areas from having the heavy metal deposited thereon and not produce the silicide.

The process flows, times and temperatures, implantation doses, dimensions, and the like in the fabrication processes described above are well-known in the art and are not described further herein.

Figure 3:
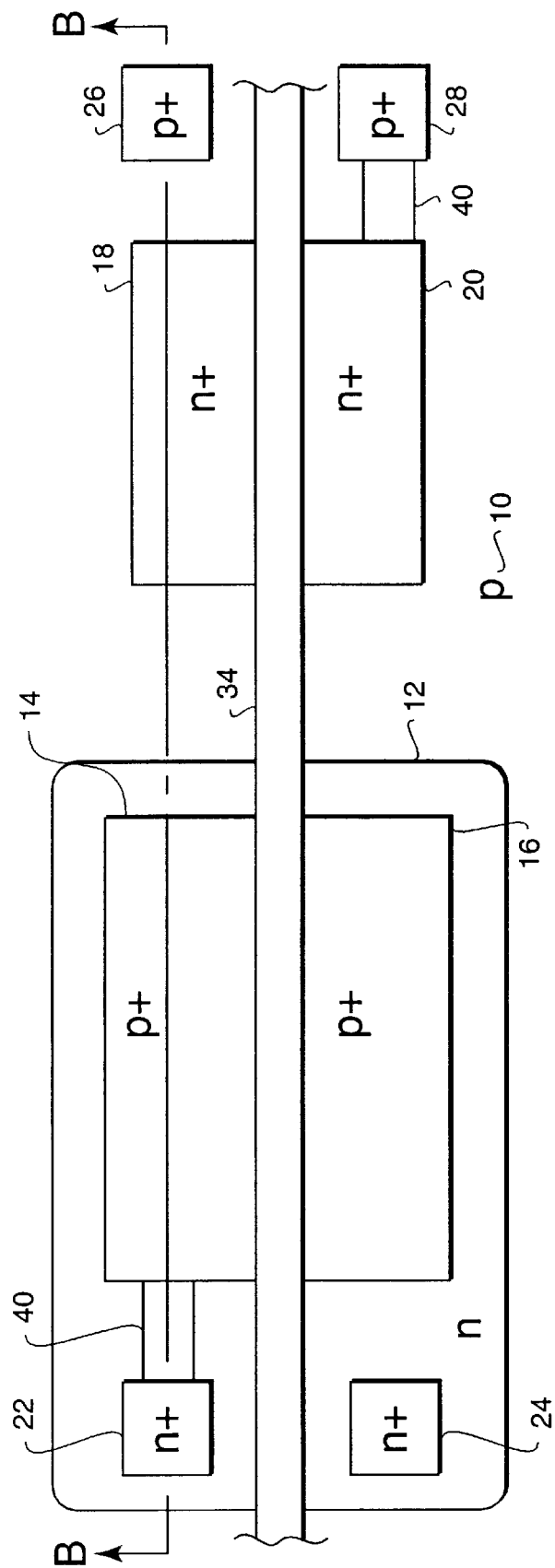
FIG. 3 shows a schematic top plan view of a CMOS pair embodiment in accordance with the present invention.
Figure 4:
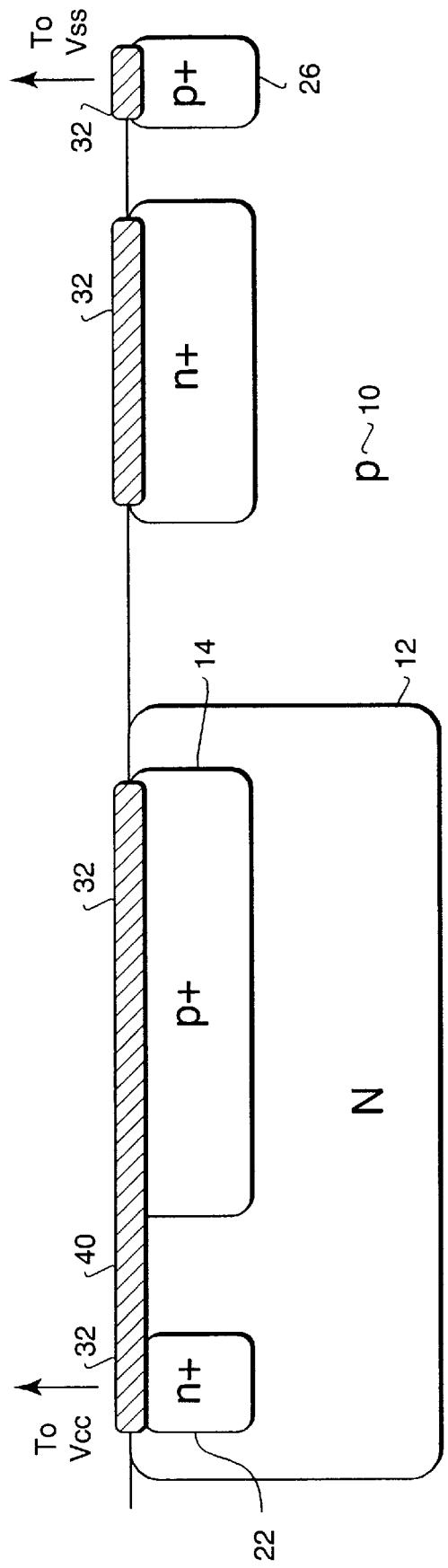
FIG. 4 shows a schematic sectional side view of a CMOS pair embodiment in accordance with the present invention as depicted in FIG. 3 taken along section line B—B.

Now to best understand the present invention, reference is made to FIG. 3 and FIG. 4 collectively. FIG. 3 and FIG. 4 depict, schematically, a respective top plan view and a side section view of a typical CMOS pair in accordance with one embodiment of the present invention. As was depicted in FIG. 1 and FIG. 2, there are similar aspects indicated by similar reference numerals, the fabrication of which occurs in a similar manner as described above. In P-substrate 10 N-well 12 is formed. Polysilicon gate 34 is then deposited creating a channel between any desired source and drain to be formed. In N-well 12 is a p+ source/drain 14 and p+ source/drain 16 formed by implantation. In P-substrate 10 there is also n+ source/drain 18 and n+ source/drain 20 formed by implantation. There are also n+ regions 22, 24 formed by implantation for connection to a Vcc source and p+ regions 26, 28 formed by implantation for connection to a Vss source. Silicide layer 32 (which is shown as before in exaggerated thickness proportion for illustration purposes and is depicted as "eating into" the substrate surface) is formed over n+ regions 22, 24, p+ regions.26, 28, p+ source/drains 14, 16, and n+ source/drains 18, 20. However, in addition, in accordance with the present invention, there is a selected silicide layer 40 interconnecting n+ region 22 and p+ source/drain 14. This silicide layer 40 which merges with silicide layer 32 over n+ region 22 and p+ source/drain 14 is formed at the same time as silicide layer 32 is formed. Silicide layer 40 would therefore be in the same 100 Å–200 Å depth range. In one preferred embodiment, where n+ region 22 is generally square-shaped with a 4,000 Å width dimension and where source/drain 14 has a 7,000 Å width (shorter) dimension, silicide layer 40 would have a width dimension of 3,750 Å. One or more other silicide layers 40, if desired, could also be used to interconnect other or all active areas, such as between n+ region 20 and p+ region 28 as shown in FIG. 3, as would be determined by the circuit design components needing interconnection and which the designer would prefer having camouflaged. Thereafter, for the connection to the Vcc and Vss sources normal processing would take place, namely, providing appropriate field oxides and metalization layer(s) for the contacts connecting to the respective Vcc and Vss sources.

It should be noted that the process steps utilized to produce the FIG. 1 / FIG. 2 structure are the same to produce the FIG. 3 / FIG. 4 structure, with the exception that the masking needed to produce the silicide layer 32 as depicted in FIG. 1 / FIG. 2 would be different in that it would include an additional opening(s) as desired to allow the forming of silicide layer 40 over undoped areas which would merge (i.e., form a continuous surface) with silicide layer 32. The openings defining silicide layer 40, which merges with silicide layer 32, would be selected by the developer as desired such that standard upper level metal layer interconnections are replaced by the silicide layer interconnections to thwart potential reverse engineering efforts.

If the reverse engineer when looking at a device having characteristics as depicted in FIG. 3 / FIG. 4 were then to attempt to determine / detect whether there is a connection between, for example, n+ area 22 and p+ source/drain 14, or p+ area 28 and n+ source/drain 20, he would typically etch down to the substrate.

However, since the silicide layer is thin (e.g., 100 Å) and hard to optically detect, it can also be eaten away when performing the etch. In such a circumstance the reverse engineer most likely would conclude that there is no connection between n+ area 22 and p+ source/drain 14. A successful camouflage of the circuit would have then been accomplished.

In accordance with the present invention, the essence of the present invention is the novel lateral interconnection between one implanted region and another implanted region, or in more general terms, where at least one of the regions is not a metal. The interconnection silicide layer in accordance with the present invention is made thick enough to minimize resistance (maximize conductance) and provide structural integrity, while being thin enough to thwart the reverse engineer's attempt to detect the interconnecting silicide layer. This optimum thickness/thinness appears to typically be in the 100 Å–200 Å range.

While techniques do exist which can detect the existence of a silicide layer, they are not realistic given the extensive number of semiconductor devices being implemented in modern integrated circuit chips. For example, a micro probe can be used to probe at the connector to determine its connectivity or a crosssectional analysis can be done of a specific area. However, these techniques can be applied to only one small region at a time. Thus it becomes extremely difficult to use these techniques for reverse engineering of a typical circuit, which has hundreds of thousands or more of these connectors. The effort and time involved in determining all such connections so as to extract the design from the chip by reverse engineering becomes excessive and impractical.

Those skilled in the art can also appreciate that while the invention has been described with respect to a CMOS pair, the invention can be practiced with other semiconductor devices which can utilize silicide (salicide), such as semiconductor diodes, transistors, memory devices and the like. Also the silicide path between the connected areas need not be a straight line. Similarly, it should be understood that the invention can also be practiced where the CMOS substrate is an N-type and the well is a P-well.

What is claimed is:

1. A method for protecting semiconductor integrated circuits from reverse engineering, comprising the steps of:
    fabricating semiconductor active areas on a substrate; and
    forming a silicide layer both over at least one active area of the semiconductor active areas and over a selected substrate area for interconnecting the at least one active area with another area through the silicide layer formed on the selected substrate area.

2. The method of claim 1, wherein the step of forming a silicide layer includes the step of interconnectingly merging a silicide layer formed on a first active area with a silicide layer formed on a second active area through the silicide layer formed on the selected substrate area.

3. The method of claim 2, wherein the step of interconnectingly merging includes the step of interconnectingly merging the silicide layer formed on the first active area laterally with the silicide layer formed on the second active area through the silicide layer formed on the selected substrate area.

4. The method of claim 1, wherein the step of fabricating semiconductor active areas on a substrate includes the step of fabricating a CMOS pair on the substrate.

5. The method of claim 4, wherein an n+ source/drain is interconnected to a Vss source through a first silicide layer over the substrate and a p+ source/drain is interconnected to a Vcc source through a second silicide layer over the substrate.

6. A method of interconnecting semiconductor areas on a substrate comprising forming a silicide layer both over an active area and over a selected substrate area for interconnecting the active area with another area through the silicide layer formed on the selected substrate area.

7. The method of claim 6, wherein the step of forming a silicide layer includes the step of interconnectingly merging a silicide layer formed on a first active area with a silicide layer formed on a second active area through the silicide layer formed on the selected substrate area.

8. The method of claim 7, wherein the step of interconnectingly merging includes the step of laterally interconnectingly merging the silicide layer formed on the first active area with the silicide layer formed on the second active area through the silicide layer formed on the selected substrate area.

9. The method of claim 6, wherein the active area is a source/drain of a CMOS pair on the substrate.

10. The method of claim 9, wherein an n+ source/drain is interconnected to a Vss source through a first silicide layer over the substrate and a p+ source/drain is interconnected to a Vcc source through a second silicide layer over the substrate.

11. A method of making semi-conductor integrated circuits comprising the steps of:
    fabricating semi-conductor active areas on a substrate, at least two of said active areas being remotely spaced from each other on said substrate; and
    forming a silicide layer over said at least two active areas, said silicide layer interconnecting said two active areas one with the other to provide a electrical conduction path in said silicide layer between said two active areas.

* * * * *